United States Patent
Yuan (10) Patent No.: US 10,362,697 B2
(45) Date of Patent: Jul. 23, 2019

(54) SUPPORT FOR A MOBILE ELECTRONIC DEVICE

(71) Applicant: Chen-Kee Yuan, Vancouver (CA)

(72) Inventor: Chen-Kee Yuan, Vancouver (CA)

(*) Notice: Subject to any disclaimer, the term of this patent is extended or adjusted under 35 U.S.C. 154(b) by 0 days.

(21) Appl. No.: 15/799,200

(22) Filed: Oct. 31, 2017

(65) Prior Publication Data
US 2018/0213664 A1 Jul. 26, 2018

(30) Foreign Application Priority Data

Jan. 20, 2017 (CA) .................................... 2955524

(51) Int. Cl.
| | | |
|---|---|---|
| *F16M 13/04* | (2006.01) | |
| *H05K 5/02* | (2006.01) | |
| *F16M 11/00* | (2006.01) | |
| *F16B 47/00* | (2006.01) | |
| *F16B 11/00* | (2006.01) | |

(52) U.S. Cl.
CPC ........... *H05K 5/0234* (2013.01); *F16M 11/00* (2013.01); *H05K 5/0226* (2013.01); *F16B 11/006* (2013.01); *F16B 47/00* (2013.01)

(58) Field of Classification Search
CPC .... F16M 11/2021; F16M 13/04; F16M 11/22; A45F 2200/0516; B60R 11/0241
See application file for complete search history.

(56) References Cited

U.S. PATENT DOCUMENTS

| | | |
|---|---|---|
| 552,171 A | 12/1895 | Farnham |
| 3,503,546 A | 3/1970 | Hunt |
| 4,606,484 A | 8/1986 | Winter et al. |
| 6,550,108 B2 | 4/2003 | Pratl |
| 6,762,685 B2 | 7/2004 | Muto et al. |
| 7,354,304 B2 | 4/2008 | Livingston |
| 8,428,664 B1 | 4/2013 | Wyers |
| 8,550,317 B2 | 10/2013 | Hyseni |
| 9,128,668 B2 | 9/2015 | Johnson |
| D749,069 S | 2/2016 | Senoff |
| 9,323,135 B1 * | 4/2016 | Veloso .................... F16M 13/00 |
| 9,723,910 B2 * | 8/2017 | Due .......................... A45F 5/10 |
| 9,764,693 B1 * | 9/2017 | Biondo ............... B60R 11/0241 |

(Continued)

OTHER PUBLICATIONS

Written Opinion corresponding to PCT/CA2018/050031 dated Apr. 16, 2018.

(Continued)

*Primary Examiner* — Bradley Duckworth
(74) *Attorney, Agent, or Firm* — Davis & Bujold PLLC; Michael J. Bujold (57) ABSTRACT

A support for a mobile electronic device which includes a rigid elongated base strip approximately a length of a mobile electronic device. The base strip is longer than wide and has a first end, a second end, an upper surface, and a lower surface. An elongated layer of material, having upwardly projecting micro-suction cups, is secured to the upper surface of the base strip. According to a first aspect, a rigid support member is provided that, when in an operative position, extends substantially vertically from the upper surface at the second end of the base strip. According to a second aspect, an attachment band is provided that enables the base strip to be mounted to a human hand.

8 Claims, 8 Drawing Sheets

(56) References Cited

U.S. PATENT DOCUMENTS

| | | | |
|---|---|---|---|
| 2002/0130227 A1* | 9/2002 | Kolb | B60R 11/0241 |
| | | | 248/127 |
| 2010/0213331 A1* | 8/2010 | Liou | F16M 11/105 |
| | | | 248/176.3 |
| 2011/0297566 A1 | 12/2011 | Gallagher et al. | |
| 2012/0074271 A1 | 3/2012 | Goetz | |
| 2012/0180916 A1 | 7/2012 | Swain | |
| 2014/0131251 A1* | 5/2014 | Westrup | A45C 11/00 |
| | | | 206/756 |
| 2015/0009610 A1 | 1/2015 | London et al. | |
| 2015/0041609 A1* | 2/2015 | Lee | F16M 11/10 |
| | | | 248/447 |
| 2015/0083615 A1* | 3/2015 | Lay | G06F 1/1616 |
| | | | 206/45.24 |
| 2015/0252936 A1* | 9/2015 | Krantz | F16M 11/046 |
| | | | 248/176.1 |
| 2015/0288407 A1* | 10/2015 | Hernandez | H04B 1/3888 |
| | | | 224/267 |
| 2015/0289575 A1 | 10/2015 | Krautner | |
| 2016/0033074 A1* | 2/2016 | Drakos | F16M 11/041 |
| | | | 248/122.1 |
| 2016/0120297 A1* | 5/2016 | Senoff | A45F 5/00 |
| | | | 294/137 |
| 2017/0065063 A1* | 3/2017 | Freeman | A45F 5/00 |

OTHER PUBLICATIONS

International Search Report corresponding to PCT/CA2018/050031 dated Apr. 16, 2018.
https://www.kickstarter.com/projects/packandsmooch/tabstrap-holder-stand-and-base-for-ipad-and-more-t?ref=category_popular&ref=discovery#, TabStrap—iPad hand strap & iPad stand with suction tape, by Pack & Smooch, Hamburg, Germany.

\* cited by examiner

SUPPORT FOR A MOBILE ELECTRONIC DEVICE

FIELD

There is described a support for a mobile electronic device, such as a smart phone or a tablet computer.

BACKGROUND

Mobile electronic devices, such as smart phones and tablet computers, are now being used to watch movies and for video conferencing applications, such as SKYPE. To facilitate such uses various support stands have been developed. An example of a support stand for a mobile electronic device is U.S. Patent Publication 20120074271 (Goetz).

It is not unusual for mobile electronic devices to sustain damage when dropped. For this reason, various supports have been developed to secure a mobile electronic device or a mobile electronic device case to a human hand. An example of a support that protects against dropping a mobile electronic device are U.S. Design Pat. D749,069 (Senoff), and the following U.S. Utility Patents: U.S. Pat. No. 6,550,108 (Pratl), U.S. Pat. No. 7,354,304 (Livingstone) and U.S. Pat. No. 8,550,317 (Hyseni).

SUMMARY

There is provided a support for a mobile electronic device that has two aspects. According to a first aspect there is provided a support for a mobile electronic device which includes a rigid elongated base strip approximately a length of a mobile electronic device. The base strip is longer than wide and has a first end, a second end, an upper surface, and a lower surface. An elongated layer of material, having upwardly projecting micro-suction cups, is secured to the upper surface of the base strip. A rigid support member is provided that, when in an operative position, extends substantially vertically from the upper surface at the second end of the base strip.

In use, base strip can be placed on a table or similar flat surface and a mobile electronic device can be supported in an upright orientation for the purpose of watching movies or video conferencing. A bottom edge of the mobile electronic device is engaged in a selected position by the micro-suction cups on the base strip. The mobile electronic device is then leaned up against the rigid support member that extends substantially vertically from upper surface at the second end of the base strip. It will be appreciated that the user may select any desired angular positioning for the mobile electronic device along the elongated layer of material.

According to a second aspect there is provided a support for a mobile electronic device which includes a rigid elongated base strip approximately a length of a mobile electronic device. The base strip is longer than wide and has a first end, a second end, an upper surface, and a lower surface. An elongated layer of material, having upwardly projecting micro-suction cups, is secured to the upper surface of the base strip. An attachment band is fixed to the lower surface of the base strip, whereby the base strip is mounted to a human hand by the attachment band.

In use, the base strip is mounted to a human hand by the attachment band. A back of a mobile electronic device is then laid across the elongated layer of material. The mobile electronic device is held in place by the micro-suction cups.

While a product could be sold featuring either the first aspect of the support or the second aspect of the support, it is envisaged that the support will be sold with a coupling positioned on the upper surface at the second end of the base strip for the purpose of engaging the rigid support member. This will enable the rigid support member to be inserted into the coupling to facilitate use according to the first aspect or removed from the coupling to facilitate use according to the second aspect.

It is preferred that the lower surface of the base strip have an attachment band recess and the attachment band is movable between a stored position within the attachment band recess and an operative position depending from the attachment band recess past the lower surface of the base strip. This enables attachment band to be placed in the stored position within the attachment band recess when the support is being used according to the first aspect with the lower surface of the base strip resting on a table or other flat surface.

BRIEF DESCRIPTION OF THE DRAWINGS

These and other features will become more apparent from the following description in which reference is made to the appended drawings, the drawings are for the purpose of illustration only and are not intended to be in any way limiting, wherein.

DETAILED DESCRIPTION

A support for a mobile electronic device generally identified by reference numeral 10, will now be described with reference to FIG. 1 through FIG. 5. A version of support 10 that will soon be commercially available for sale to the public, will be described with reference to FIG. 6 through FIG. 11 in order to meet best mode requirements.

Figure 1:
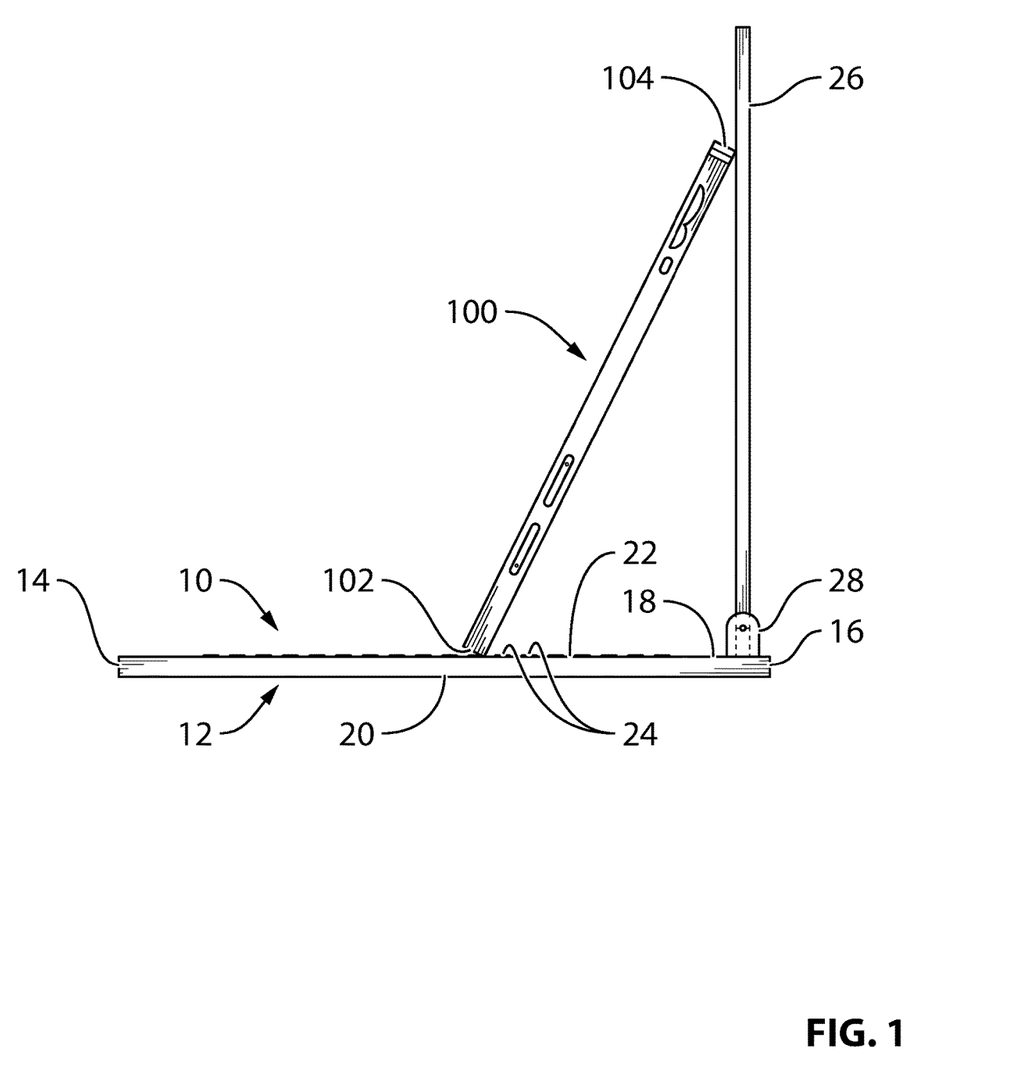
FIG. 1 is a side elevation view of a support for a mobile electronic device with a mobile electronic device positioned in a first angular orientation.
Figure 2:
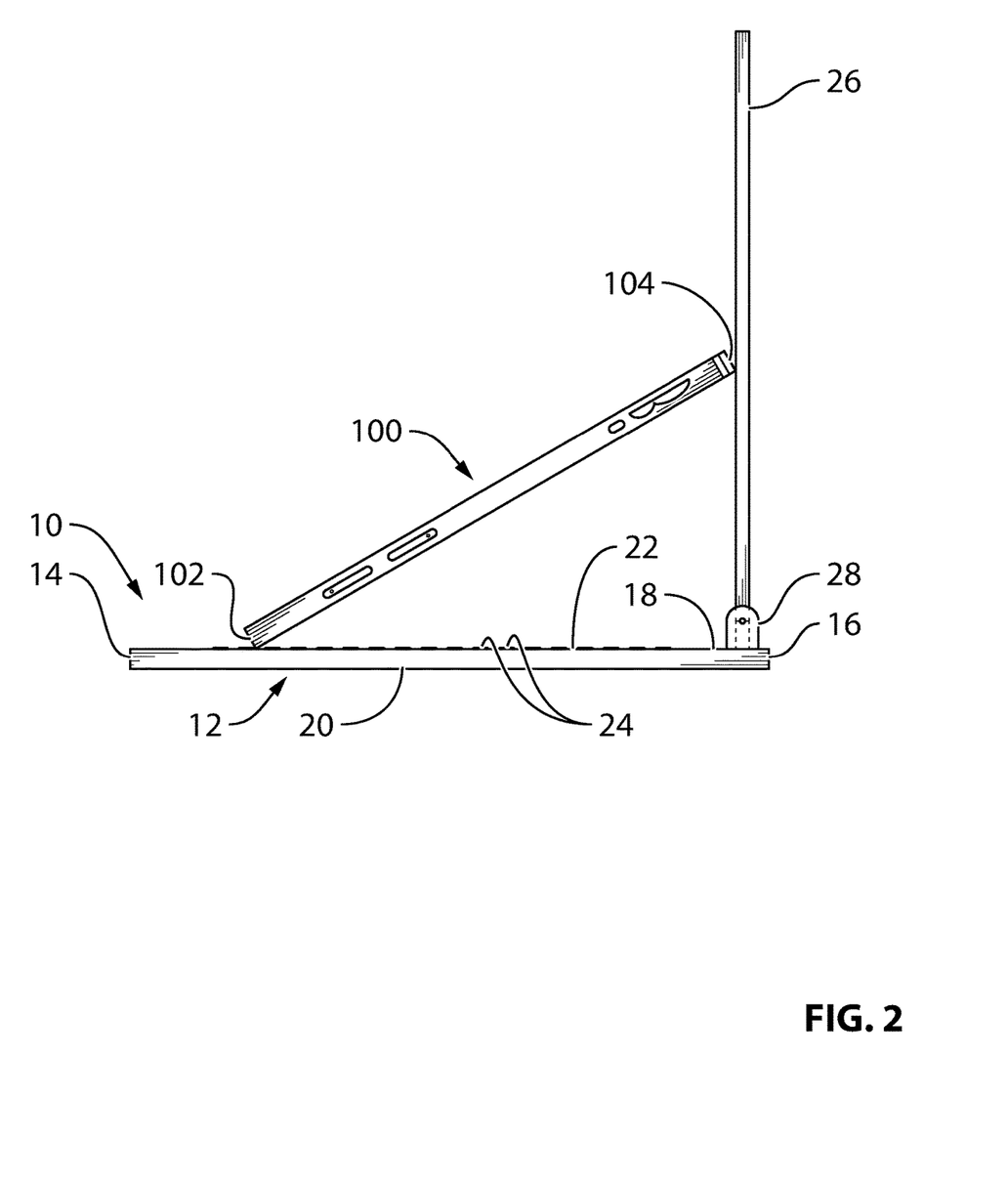
FIG. 2 is a side elevation view of the support for a mobile electronic device of FIG. 1, with the mobile electronic device positioned in a second angular position.
Figure 3:
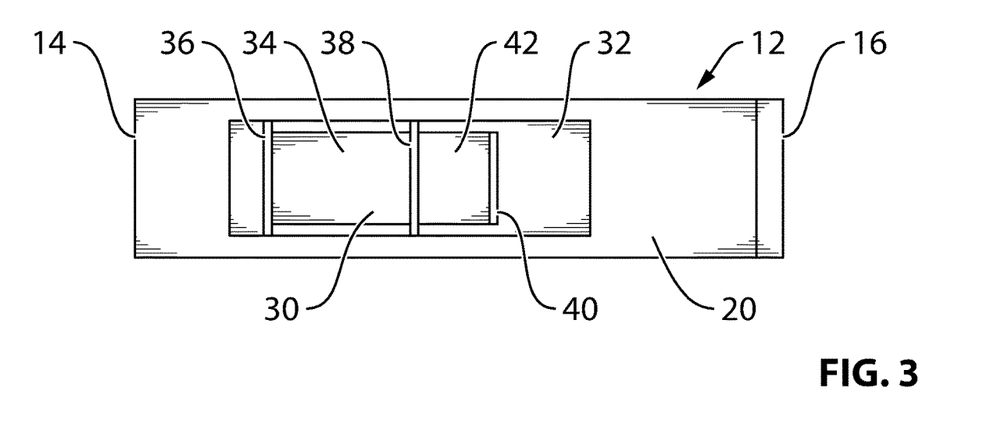
FIG. 3 is a bottom plan view of the support for a mobile electronic device of FIG. 1.
Figure 4:
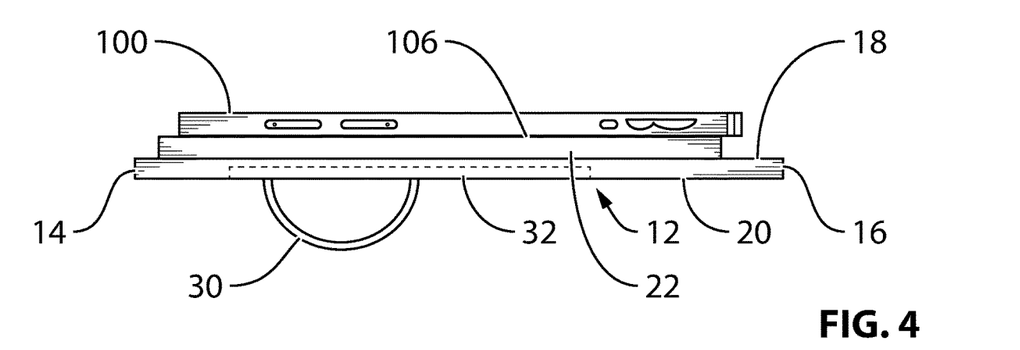
FIG. 4 is a side elevation view, in section of the support for a mobile electronic device of FIG. 1, with rigid support member removed.
Figure 5:
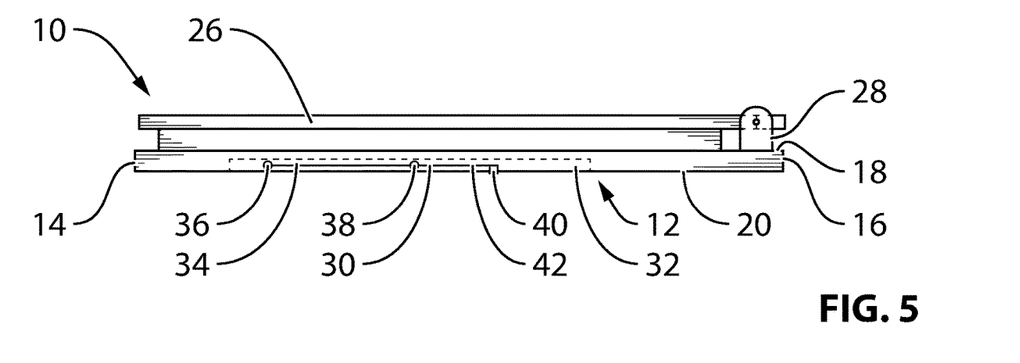
FIG. 5 is a side elevation view of the support for a mobile electronic device of FIG. 1, with the rigid support member pivoted to a stored position.

Structure and Relationship of Parts:

Referring to FIG. 1 and FIG. 2, support 10 includes a rigid elongated base strip 12 approximately a length of a mobile electronic device. Base strip 12 is longer than wide and has a first end 14, a second end 16, an upper surface 18, and a lower surface 20. An elongated layer of material 22 is secured to upper surface 18 of base strip 12. Elongated layer of material 22 has upwardly projecting micro-suction cups 24. A rigid support member 26 that extends substantially vertically from upper surface 18 at second end 16 of base strip 12. A coupling 28 is positioned on upper surface 18 at second end 16 of base strip 12 for the purpose of engaging rigid support member 26. Referring to FIG. 4, rigid support member 26 is removable from coupling 28. An attachment band 30 is provided depending from lower surface 20 of base strip 12. This enables base strip 12 to be mounted to a human hand by means of attachment band 30. Referring to FIG. 3 and FIG. 4, lower surface 20 of base strip 12 has an attachment band recess 32. Referring to FIG. 3, attachment band 30 has a stored position within attachment band recess 32. A first end 34 of attachment band 30 is secured within attachment band recess 32 by an anchor pin 36. A redirection pin 38 overlies attachment band 30. A stop 40 is secured to a second end 42 of attachment band 30. Attachment band 30 can be made to depend from attachment band recess 32, however, stop 40 at second end 42 of attachment band 30 prevents second end 42 from being drawn past redirection pin 38. Referring to FIG. 4, attachment band 30 has an operative position depending from attachment band recess 32 past lower surface 20 of base strip 12. Referring to FIG. 5, a preferred form of coupling 28 is a hinge. When coupling 28 is a hinge, the hinge coupling permits rigid support member 26 to be pivoted to a stored position parallel to base strip 12 and engaged with elongated layer of material 22 having upwardly projecting micro-suction cups 24.

Operation:

Referring to FIG. 5, support 10 is carried in a stored position. Referring to FIG. 1 and FIG. 2, when support 10 is used in accordance with a first aspect, lower surface 20 of base strip 12 is placed on a table (not shown) or similar flat surface. Rigid support member 26 is pivoted to an operative upright position. A mobile electronic device 100 is then supported in an upright orientation for the purpose of watching movies or video conferencing. A bottom edge 102 of mobile electronic device is engaged in a selected position by micro-suction cups 24 projecting upwardly from elongated layer of material 22 on base strip 12. A top edge 104 of mobile electronic device 100 is then leaned up against rigid support member 26 that extends substantially vertically from upper surface 18 at second end 16 of base strip 12. By comparing FIG. 1 with FIG. 2, it will be appreciated that a user may select any desired angular positioning for mobile electronic device 100 along elongated layer of material 22.

Referring to FIG. 4, when support 10 is used in accordance with a second aspect, rigid support member 26 is detached from coupling 28. Base strip 12 is then mounted to a human hand (not shown) by means of attachment band 30. A back 106 of mobile electronic device 100 is then laid across elongated layer of material 22. Mobile electronic device 100 is held in place by micro-suction cups 24 that project upwardly from elongated layer of material 22.

Variations:

It will be appreciated that while support 10 can be used in accordance with either the first aspect or the second aspect, someone may wish a more limited embodiment that is focused solely upon the first aspect or solely upon the second aspect.

Cautionary Warnings:

While micro-suction cup technology may improve in future, micro-suction cups 24 currently have limited holding power. In order for micro-suction cups 24 to securely hold mobile electronic device 100 in accordance with the second aspect, there must be a sufficient surface area coverage.

Advantages Over Prior Art

1. Some of the prior art devices require that an adhesive strip be affixed to the phone. This adhesive strip is a "semi-permanent" attachment. It is not intended to be removed. In contrast, the micro-suction cups 24 of support 10 hold the mobile electronic device securely with a transitory connection. This enables support 10 to be used with a variety of mobile electronic devices. This avoids any attachment device being secured to mobile electronic device 100, which would adversely affect its aesthetic appearance.

2. Support 10, as described, can be used with respect to both the first aspect and the second aspect described above, thereby replacing the functioning of two prior art supports.

3. When used in accordance with the first aspect, mobile electronic device 100 can be positioned at any desired viewing angle.

Figure 6:
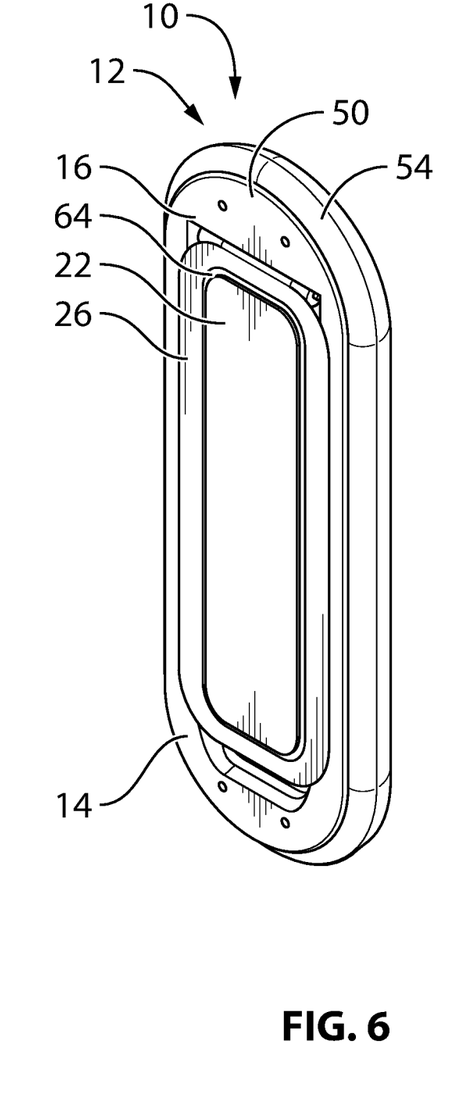
FIG. 6 is a top plan view of a commercial version of support for a mobile electronic device, with the rigid support member in a stored position.
Figure 7:
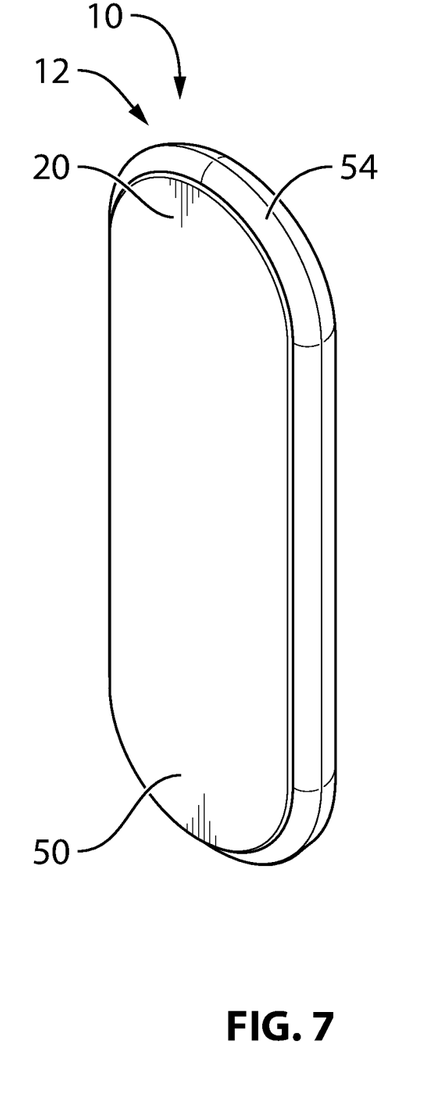
FIG. 7 is a bottom plan view of a commercial version of support for a mobile electronic device, with the rigid support member in a stored position.
Figure 8:
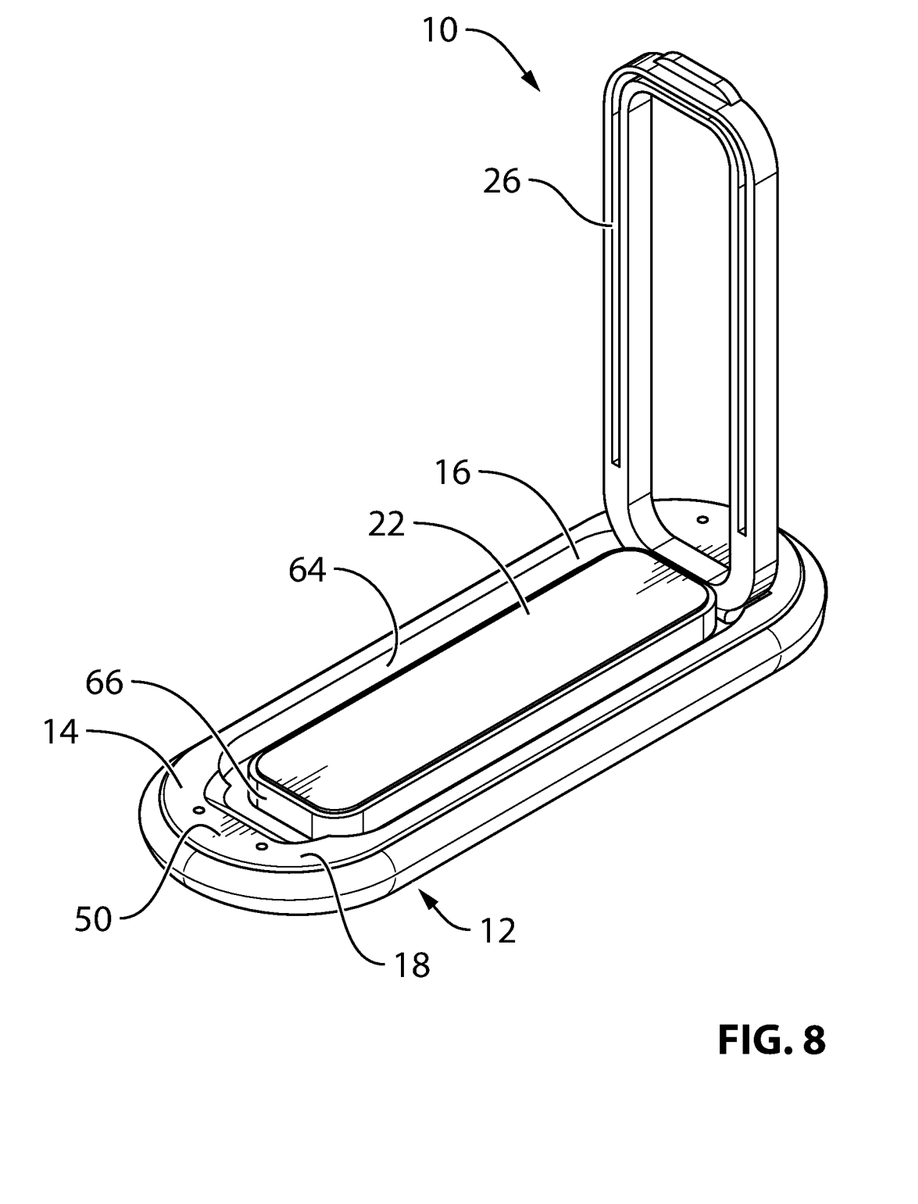
FIG. 8 is a perspective view taken from a first end of the commercial version of support for a mobile electronic device illustrated in FIG. 6, with the rigid support member in an operative position.

Referring to FIG. 6 through FIG. 8, this commercial version of support 10 has been taken beyond the conceptual stage to a version ready to be manufactured and sold to the public. The same reference numerals used above will be used in the description of this commercial version. Where this commercial version has elements not present in the embodiment described above, new reference numerals will be assigned.

Figure 10:
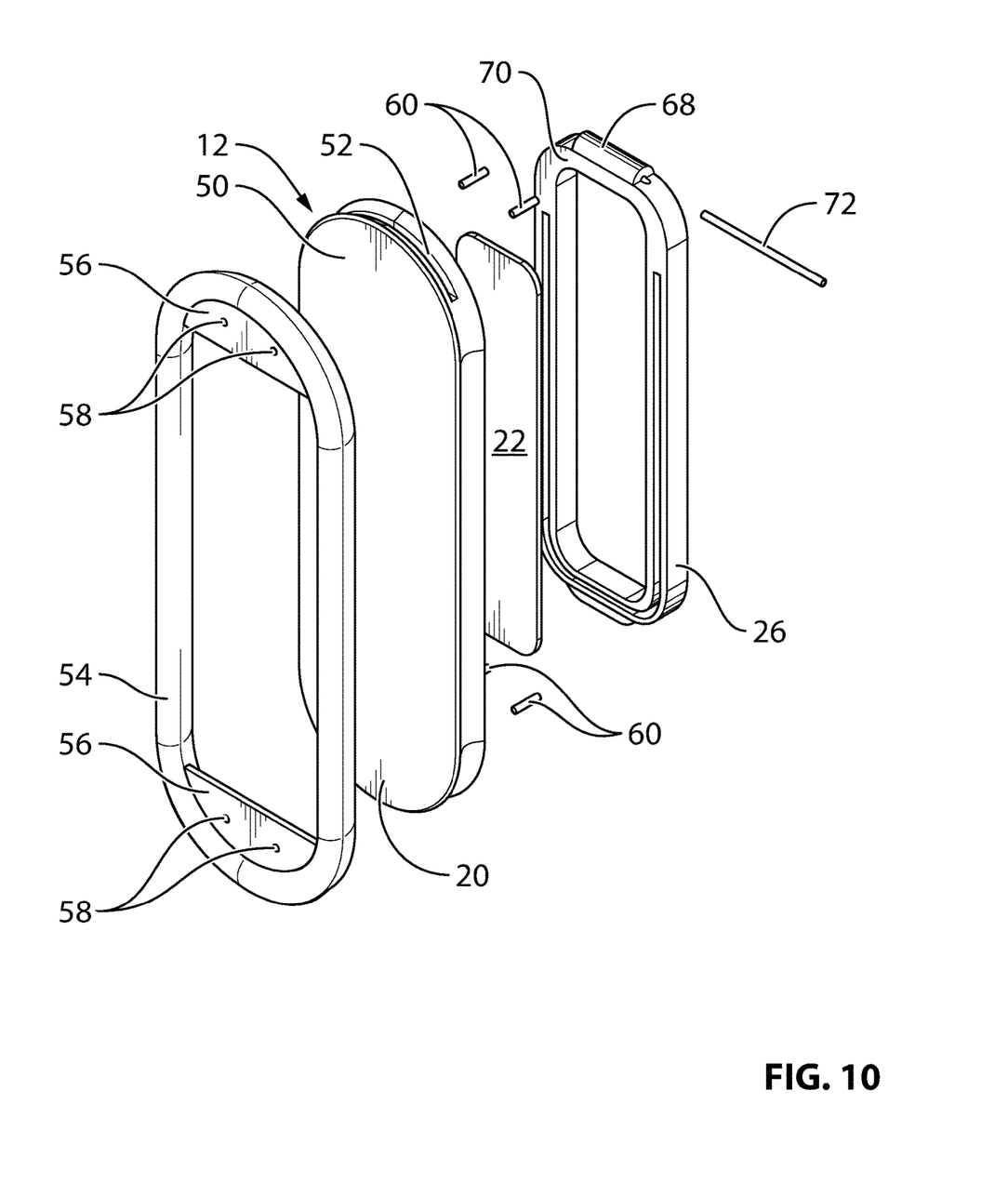
FIG. 10 is an exploded perspective view as viewed from a lower surface of the commercial version of support for a mobile electronic device illustrated in FIG. 6.
Figure 11:
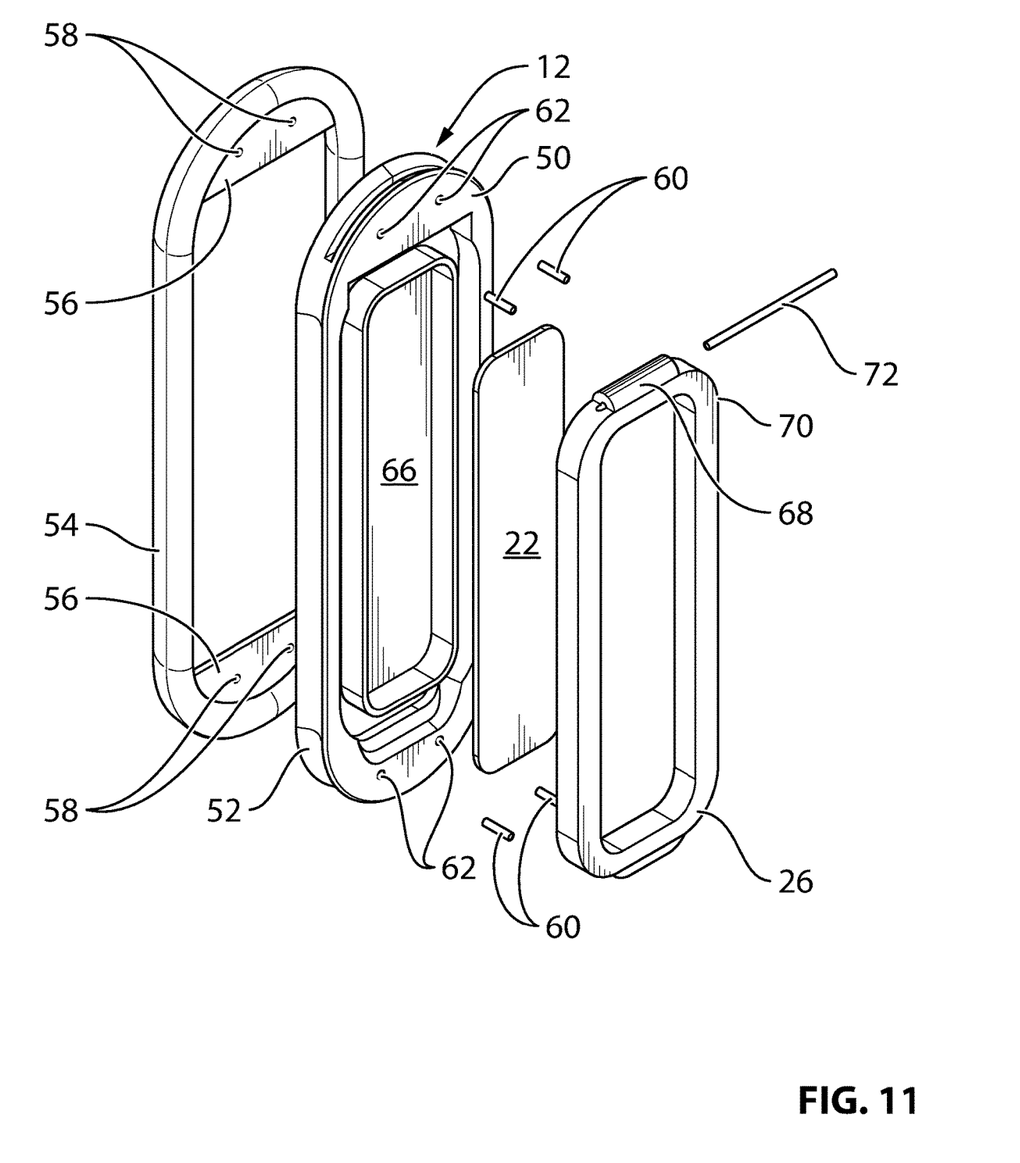
FIG. 11 is an exploded perspective view as viewed from an upper surface of the commercial version of support for a mobile electronic device illustrated in FIG. 6.

Referring to FIG. 10 and FIG. 11, in this embodiment, rigid elongated base strip 12 has a main body 50 of aluminum that is oval in shape. Main body 50 has a circumferential edge groove 52, which accommodates a molded silicone border 54. Molded silicone border 54 is accommodated by and friction fit within circumferential groove 52. Molded silicone border 54 provides both an aesthetically pleasing finish and impact protection for main body 50. In order to prevent molded silicone border 54 from being dislodged by impact, inwardly projecting engagement tongues 56 are provided that have holes 58 through which attachment pins 60 extend. Attachment pins 60 extend not only through holes 58 but also through aligned holes 62 in main body 50, so molded silicone border is secured to main body 50 to become part of base strip 12.

Figure 9:
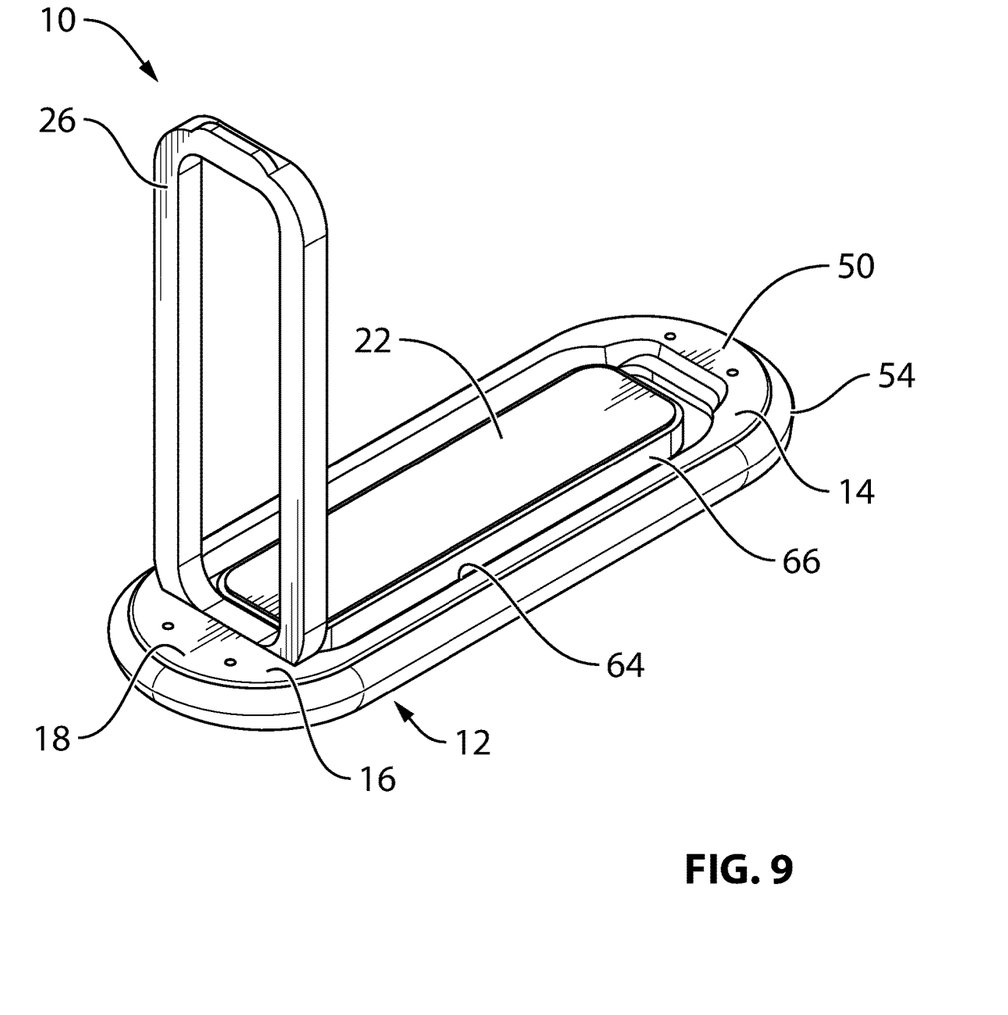
FIG. 9 is a perspective view taken from a second end of the commercial version of support for a mobile electronic device illustrated in FIG. 6, with the rigid support member in an operative position.

Referring to FIG. 7 and FIG. 10, lower surface 20 of base strip 12 is plain. For promotional purposes lower surface 20 has been branded with a brand name. Referring to FIG. 11, upper surface 18 of base strip 12 has an oval groove 64 which surrounds a central portion 66. Referring to FIG. 8, central portion 66 of upper surface 18 supports elongated layer of material 22, which is adhered to central portion 66. Elongated layer of material 22 has upwardly projecting micro-suction cups 24. It is to be noted that as support 10 is a transitory use, adhesive should not be used on the upwardly projecting surface, only micro-suction cups 24 or an equivalent. Referring to FIG. 6, oval groove 64 accommodates rigid support member 26. Rigid support member 26 is molded out of a polymer plastic in an oval shape, so that it can fit within oval groove 64 when in the stored position. This is an improvement over the original embodiment, for when in the stored position rigid support member 26 is substantially flush with upper surface 18. This eliminates any raised portions which would catch on clothing, when support 10 is carried in a user's pocket. Referring to FIG. 8 and FIG. 9, in the operative position rigid support member 26 extends substantially vertically from upper surface 18 at second end 16 of base strip 12. Coupling 28 which permits this pivotal movement to occur from the stored position within oval groove 64 to the operative position is positioned on upper surface 18 at second end 16 of base strip 12. In this embodiment, coupling 28 is recessed within oval groove 64. Referring to FIG. 10 and FIG. 11, coupling 28 includes a tube 68 that is integrally molded across an end 70 of rigid support member 26. A pivot pin 72 extends through tube 68 forming a hinge. Pivotal movement of rigid support member 26 is limited by oval groove 64, so that rigid support member 26 cannot go much beyond a substantially vertical position when in the operative position.

The operation of the commercial version of support 10 does not differ in any material way from the description of operation of support 10. Referring to FIG. 6 and FIG. 7, commercial version of support 10 is carried in a user's pocket in the stored position. Referring to FIG. 8 and FIG. 9, when lower surface 20 of base strip 12 is placed on a table or similar flat surface. Rigid support member 26 is then pivoted to the operative upright position. A mobile electronic device is then supported in an upright orientation for the purpose of watching movies or video conferencing. A bottom edge of the mobile electronic device is engaged in a selected position by micro-suction cups 24 projecting upwardly from elongated layer of material 22 on base strip 12. A top edge of the mobile electronic device is leaned up against rigid support member 26. The user may select any desired angular positioning for the mobile electronic device along elongated layer of material 22. Friction force provided by layer of material 22 is used to prevent the mobile electronic device from sliding along upper surface 18. The mobile electronic device leans back against rigid support member 26, rigid support member 26 just needs to be robust enough to resist this leaning force and does not have to bear the entire weight of the mobile electronic device. Micro-suction cups do not leave any traces or residue upon the surface of the mobile electronic device and separate from the mobile electronic device easily. There is no permanent or semi-permanent attachment, as it the case with adhesive.

In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be one and only one of the elements.

The scope of the claims should not be limited by the illustrated embodiments set forth as examples, but should be given the broadest interpretation consistent with a purposive construction of the claims in view of the description as a whole.

What is claimed is:

1. A mobile phone support comprising:
   a rigid and planar base having an upper surface;
   a layer of micro-suction cup material secured to a central portion of the upper surface of the base, thereby providing a first mobile phone engagement surface;
   a hand attachment band on the base; and
   an oval support member pivotally mounted to the base and movable between a stored position and an operative position, when the oval support member is in the operative position, the support member extends substantially vertically and perpendicular to the upper surface, a surface of the support member, facing toward the base forming a second mobile phone engagement surface for engaging and supporting a mobile phone, such that during use of the mobile phone support, a pair of opposed edges of the mobile phone respectively engage with the first mobile phone engagement surface and the second mobile phone engagement surface to support the mobile phone at a desired viewing angle and, when in the stored position, the support member surrounds and is flush with the central portion of the upper surface, thereby leaving the first mobile phone engagement surface unobstructed and available to receive the mobile phone.

2. The mobile phone support of claim 1, wherein a groove is formed in the upper surface of the base, the groove is spaced inwardly from a periphery of the base and surrounds the central portion of the upper surface and, when the oval support member is in the stored portion, the support member is received within the groove with pivotal movement of the support member, when in the operative position, being limited by the groove.

3. The mobile phone support of claim 1, wherein the hand attachment band is attached to the base, and the hand attachment band is movable between a stored position against the base and an operative position.

4. The mobile phone support of claim 1, wherein the base is elongated having a width which is shorted than a length of the base with a first end of the base located along a shorter edge of the base and a second end located along a shorter edge of the base opposed to the first end, the base has a circumferential edge with a molded silicone border positioned along the circumferential edge, and the molded silicone border is secured at the first end and the second end of the base.

5. The mobile phone support of claim 4, wherein the support member is pivotally mounted to the upper surface in from the circumferential edge and toward one of the first end or the second end of the base.

6. The mobile phone support of claim 4, wherein the molded silicone border has a first inwardly projecting engagement tongue which is secured in a groove at the first end of the base and a second opposed inwardly projecting engagement tongue that is secured in a groove at the second end of the base.

7. A mobile electronic device support for a mobile electronic device, the mobile electronic device support comprising:
   a rigid and planar elongated base strip having an upper surface, a lower surface and a width of the base strip which is shorter than a length of the base strip such that a first end is located along a shorter edge of the base strip and a second end is located along an opposed shorter edge of the base strip;
   the upper surface of the base strip having a first mobile phone engagement surface comprising an elongated layer of material secured thereto, and the elongated layer of material having upwardly projecting micro-suction cups;
   an oval groove being formed in the upper surface of the base strip, the oval groove being spaced from a periphery of the base strip edge and the oval groove surrounding a central portion of the upper surface;
   a coupling being at least partially located within the oval groove adjacent the second end of the base strip and the coupling pivotably supporting one end of a rigid and planar oval support member, the oval support member being sized and shaped to be received within the oval groove so that the oval support member, when in a stored position, is at least partially received within the oval groove and thus extends substantially parallel to the base strip, and, when the oval support member is in an operative position, the oval support member extends substantially vertical and perpendicular to the upper surface adjacent, but spaced inwardly from the second end of the base strip, and a surface of the oval support member, facing toward the base strip, forming a second mobile phone engagement surface for engaging and supporting the mobile electronic device, and, during use of the support in the operative position, a pair of opposed edges of the mobile electronic device respectively engage with the first and the second mobile phone engagement surfaces to support the mobile electronic device on the support at a desired viewing angle; and the lower surface of the base strip has an attachment band recess and an attachment band is movable between a stored position, in which the attachment band is accommodated within the attachment band recess, and an operative position in which the attachment band depends from the attachment band recess past the lower surface of the base strip for use by a user.

8. The mobile electronic device support according to claim 7, wherein the base strip has a main body manufactured from aluminum which is oval in shape, the main body has a circumferential edge groove which accommodates a molded silicone border, and the molded silicone border is accommodated by and frictionally fitted within the circumferential groove.

* * * * *